United States Patent [19]

Hino et al.

[11] Patent Number: 5,456,817
[45] Date of Patent: Oct. 10, 1995

[54] SURFACE TREATMENT METHOD OF A COPPER FOIL FOR PRINTED CIRCUITS

[75] Inventors: Eiji Hino; Keisuke Yamanishi; Kazuhiko Sakaguchi, all of Hitachi, Japan

[73] Assignee: Nikko Gould Foil Co., Ltd., Tokyo, Japan

[21] Appl. No.: 327,138

[22] Filed: Oct. 21, 1994

Related U.S. Application Data

[63] Continuation of Ser. No. 954,708, Sep. 30, 1992, abandoned.

[30] Foreign Application Priority Data

Nov. 15, 1991 [JP] Japan ..................... 3-326674
Dec. 17, 1991 [JP] Japan ..................... 3-352922

[51] Int. Cl.$^6$ ............. C25D 3/56; C25D 11/38; H05K 1/09
[52] U.S. Cl. ............. 205/125; 205/155; 205/156; 205/176; 205/197; 205/319; 205/920; 427/96
[58] Field of Search ............. 205/125, 126, 205/155, 156, 176, 178, 197, 319, 920; 427/96, 98, 99; 428/626, 658

[56] References Cited

U.S. PATENT DOCUMENTS

| | | | |
|---|---|---|---|
| 4,456,508 | 6/1984 | Torday et al. | 204/27 |
| 4,469,567 | 9/1984 | Torday et al. | 204/27 |
| 4,572,768 | 2/1986 | Wolski et al. | 204/15 |
| 4,640,747 | 2/1987 | Ueno et al. | 204/37.1 |
| 5,057,193 | 10/1991 | Lin et al. | 204/27 |

FOREIGN PATENT DOCUMENTS

| | | |
|---|---|---|
| 0269208 | 6/1988 | European Pat. Off. . |
| 2511189 | 1/1976 | Germany . |
| 55-50484 | 4/1980 | Japan . |
| 58-500149 | 1/1983 | Japan . |
| 59-170288 | 9/1984 | Japan . |
| 61-110794 | 5/1986 | Japan . |
| 63-89698 | 4/1988 | Japan . |

OTHER PUBLICATIONS

Derwent Publications Ltd., Database WPI Week 8135, AN 81–63505D and JP–A–56 087 675 (Nippon Mining KK) 16 Jul. 1981.
Derwent Publications Ltd., Database WPI Week 8135, AN 81–63507D and JP–A–56 087 677 (Nippon Mining KK) 16 Jul. 1981.
Patent Abstract of Japan, vol. 15, No. 68 (C–0807) 18 Feb. 1991 & JP–A–02 294 490 (Nikko Guurudo Fuoiru KK) 5 Dec. 1990.
Patent Abstract of Japan, vol. 14, No. 513 (C–0777) 9 Nov. 1990 & JP–A–02 213 495 (Furukawa Electric Co.,) 20 Aug. 1990.
Derwent Publications Ltd., Database WPI Week 8135, AN 81–63514D and JP–A–56 087 695 (Nippon Mining KK) 16 Jul. 1981.

*Primary Examiner*—John Niebling
*Assistant Examiner*—William T. Leader
*Attorney, Agent, or Firm*—Seidel Gonda Lavorgna & Monaco

[57] ABSTRACT

There is disclosed a treating process whereby the thermal oxidation resistance on the shiny side of a copper foil is enhanced so that the shiny side will not discolor on heating to higher temperatures than usual, without impairing the foil's solder wettability, adhesion to resist, and other properties. A Zn-Ni alloy layer which comprises 50–97 wt % Zn and 3–50 wt % Ni or a Zn-Co alloy layer which comprises 50–97 wt % Zn and 3–50 wt % Co is formed on the shiny side of a copper foil at a deposition quantity of 100–500 μg/dm$^2$ and then the alloy surface is treated for Cr-base corrosion-preventive coating. The Cr-base corrosion-preventive treatment comprises (1) a treatment for forming a coating film of chromium oxide alone, (2) a treatment for forming a mixed coating film of chromium oxide and zinc and/or zinc oxide or (1)+(2). The roughened side of the copper foil may be treated to form thereon a layer of single metal or alloy of two or more metals chosen from among Cu, Cr, Ni, Fe, Co, and Zn. The shiny side does not cause discoloration upon exposure to high-temperature conditions of 240° C. for 30 minutes or 270° C. for 10 minutes.

9 Claims, No Drawings

SURFACE TREATMENT METHOD OF A COPPER FOIL FOR PRINTED CIRCUITS

This is a continuation of application Ser. No. 07/954,708, filed Sep. 30, 1992, now abandoned.

FIELD OF THE INVENTION

This invention relates to a process for the surface treatment of a copper foil for printed circuits. More particularly, this invention is directed to a process for treating the shiny side of a copper foil for printed circuits characterized in that a Zn-Ni alloy layer or Zn-Co alloy layer is formed on the shiny side of the copper foil before the formation of a Cr-base corrosion-preventive coating layer to improve the thermal oxidation resistance of the foil. The term "thermal corrosion resistance" is herein used to mean the foil's resistance to the discoloration due to the thermal hysteresis that the foil experiences during the fabrication of a printed circuit board.

BACKGROUND OF THE INVENTION

A copper foil for printed circuits generally is laminated and bonded to a base of a synthetic resin or the like under high temperature and high pressure, printed with a necessary circuit pattern to form an objective circuit, and then etched to remove unwanted portions. Finally, necessary elements are soldered in place, and in this way various printed circuit boards for electronic devices are fabricated. Qualitative requirements for the copper foil for printed circuits differ with the sides thereof, namely the side to be bonded to the resin base (roughened side or matte side) and the side not to be bonded (shiny side).

Some requirements for the toughened side are:
(1) No possibility of oxidative discoloration during storage;
(2) Adequate resistance to peeling from the base even after high-temperature heating, wet treatment, soldering, and chemical treatment; and
(3) Freedom from so-called stain or defect spots after a lamination operation which may result from foil lamination to the base or from etching.

Requirements for the shiny side include:
(1) Good appearance and no oxidative discoloration during storage;
(2) Good solder wettability;
(3) No oxidative discoloration from heating to an elevated temperature; and
(4) Good adhesion to a resist.

To meet these requirements, many different processes for varied purposes have hitherto been proposed for the treatment of copper foil for printed circuits on each of its toughened and shiny sides. Taking the protection treatment of copper foil against corrosion into special consideration, we previously proposed a process, as Japanese Patent Application Publication No. 33908/1986, which comprises forming a zinc coating film on the shiny side of a copper foil and then forming a chromium corrosion-preventive coating layer of a chromium oxide film. We also taught, as regards the chromium corrosion-preventive coating itself, a coating technique using a mixture of chromium oxide and zinc and/or zinc oxide by electrolytic zinc-chromium treatment (Japanese Patent Application Publication No. 7077/1983). This approach has achieved many fruitful results. Further, Japanese Patent Application Public Disclosure No. 294490/1990 disclosed another process which consists of forming a chromium oxide film by immersion chromate treatment and then forming a mixed film of chromium oxide and zinc and/or zinc oxide by electrolytic zinc-chromium treatment. The process was aimed at preventing the formation of black spots on copper foil stored under hot, humid conditions for long time.

Now, as for the thermal oxidation resistance on the shiny side of copper foil, the requirement has become more stringent within recent years. As one reason therefor, copper foils today are more often exposed to higher temperatures than before due to the advent of novel heat-resisting resins as well as a new fabrication process called "double-layer flexible base process". According to this new process, polyimide varnish is directly applied to copper foil to form a double-layer structure of a polyimide layer and a copper foil layer. Meanwhile, with conventional lamination techniques, the tendency is toward the replacement of the nitrogen atmosphere by air atmosphere for cost reduction of the laminating and curing steps. Both steps of which involve heat treatment. This calls for better thermal oxidation resistance on the shiny side of copper foil. The combined process of zinc plating and chromate treatment currently in practice allows the shiny side to resist thermal oxidation at most, e.g., at 200° C. for about 30 minutes. The foil surface discolors when treated under the higher temperature conditions, e.g., at 240° C. for 30 minutes or at 270° C. for 10 minutes, that will be needed in the years to come. Thus, in order to keep up with the more exacting demand in the future, it is necessary that the copper foil for printed circuits should secure a higher extent of thermal oxidation resistance, or sufficient resistance to remain undiscolored under the higher temperature conditions of 240° C. for 30 minutes or 270° C. for 10 minutes. The improvement should not, of course, have any deleterious effect upon the other properties required of the shiny side, such as solder wettability and adhesion to resist.

OBJECT OF THE INVENTION

The object of this invention is to develop a shiny side treatment process which provides an improvement over the ordinary combined zinc plating-chromate treatment process whereby the thermal oxidation resistance on the shiny side of copper foil is enhanced so that the shiny side remains undiscolored by the thermal hysteresis copper foil will experience during the fabrication of printed circuit boards, without having any adverse effect upon other properties such as solder wettability and resist adhesion.

SUMMARY OF THE INVENTION

It has now been found that the foregoing problems of the prior art can be solved by forming a very thin Zn-Ni alloy layer or Zn-Co alloy layer in place of the conventional plating layer of zinc alone.

Zn-Ni alloy plating itself is in use, e.g., on automotive engine room and body steel members, to enhance their resistance to heat and corrosive attacks. However, plating of those ordinary structural members and that of copper foil for printed circuits differ utterly in service environments and conditions involved. In this sense, it may safely be said that the two are entirely dissimilar techniques. Attempts have already been made to apply the Zn-Ni alloy plating to copper foils, on the roughened side rather than the shiny side, to increase its peel strength, prevent migration, and improve the resistance to hydrochloric acid and heat (e.g., Patent Application Public Disclosure Nos. 110794/1986 and 89698/1988, and Patent Application Publication No. 51272/1990). However, as noted above, the shiny and roughened sides differ entirely in the factors required. Above all, the conventionally formed plating is too thick for use on the copper foil for printed circuits because of its undesirable loss of copper foil appearance.

Also with respect to Zn-Co alloy plating and its application to a copper foil, trials have been made onto the roughened side rather than shiny side chiefly for enhancing peel strength (for example, Patent Application Public Disclosure No. 89698/1987, Patent Application Publication No. 51272/1990 etc.). As noted above, the shiny and roughened sides differ entirely in the factors required. Above all, the conventionally formed plating is too thick for use on the copper foil for printed circuits because of its undesirable loss of copper foil appearance.

It has now been surprisingly found for the first time that the thermal oxidation resistance of the shiny side of a copper foil is improved by forming a very thin Zn-Ni alloy layer or Zn-Co alloy layer thereon. This is the first finding in the art which could not have expected based on the conventional concepts.

On the basis of the above discovery, the present invention provides a process for the surface treatment of a copper foil for printed circuits characterized by the steps of forming a Zn-Ni alloy layer which comprises from 50 to 97 percent by weight of Zn and from 3 to 50 percent by weight of Ni or a Zn-Co alloy layer which comprises from 50 to 97 percent by weight of Zn and from 3 to 50 percent by weight of Co on the shiny side of a copper foil at a deposition quantity of from 100 to 500 $\mu g/cm^2$ and thereafter forming a Cr-base corrosion-preventive coating layer on said Zn-Ni alloy layer or Zn-Co.

In this case, the roughened (non-shiny) side of the copper foil is preferably treated to form thereon a layer of single metal or alloy of two or more metals chosen from among Cu, Cr, Ni, Fe, Co, and Zn.

For better atmospheric corrosion resistance, the Cr-base corrosion-preventive coating layer is preferably formed of either (1) a chromium oxide film by immersion chromate or electrolytic chromate treatment or (2) a mixed film of chromium oxide and zinc and/or zinc oxide by electrolytic zinc-chromium treatment or (3) a chromium oxide film of (1) plus a mixed film of (2).

The essence of this invention, is to form a Zn-Ni alloy film or Zn-Co alloy film on the shiny side of a copper foil.

The Zn-Ni alloying treatment is carried out, preferably using a Zn-Ni electrolytic plating bath, to form a very thin Zn-Ni alloy layer comprised of from 50 to 97 percent by weight of Zn and from 3 to 50 percent by weight of Ni at a deposition quantity of from 100 to 500 $\mu g/dm^2$. If the Ni content is less than 3 percent by weight, the thermal oxidation resistance is not improved as desired. Conversely if it exceeds 50 percent by weight, both solder wettability and thermal oxidation resistance are adversely affected. If the deposition rate of the Zn-Ni alloy layer is less than 100 $\mu g/dm^2$, no improvement in thermal oxidation resistance is obtainable. If the deposition rate is more than 500 $\mu g/dm^2$, the diffusion of Zn, etc. will deteriorate the electrical conductivity. Properly formed, the Zn-Ni alloy layer enhances the thermal oxidation resistance on the shiny side of the copper foil without impairing the other properties such as solder wettability and adhesion to resist. The design considerations are applicable to Zn-Co alloy treatment.

EXPLANATIONS OF THE EMBODIMENTS OF THIS INVENTION

The copper foil to be used in the present invention may be either electrolytic or rolled. While the present invention is concerned, in itself, with the shiny side of copper foil, the roughened side will be briefly described here by way of reference. Usually, the side of a copper foil that is to form the roughened side for bonding to a resin base is degreased and then roughened, e.g., with a knurly or nodular copper electrodeposit, so as to increase the peel strength of the copper foil after lamination. Such knurly or nodular electrodeposit can easily be formed by so-called burnt depositing. Copper plating or the like is sometimes done as a preliminary or finish treatment before or after the roughening.

In a typical copper roughening treatment, e.g., the following conditions may be used:

| Copper roughening treatment | |
|---|---|
| Cu | 10–25 g/l |
| $H_2SO_4$ | 20–100 g/l |
| Temperature | 20–40° C. |
| $D_k$ | 30–70 A/$dm^2$ |
| Time | 1–5 sec. |

Following the roughening treatment, it is desirable that the roughened surface be treated to form thereon a layer of single metal or an alloy of two or more metals chosen from among Cu, Cr, Ni, Fe, Co, and Zn. Examples of alloy plating include Cu-Ni, Cu-Co, Cu-Ni-Co, and Cu-Zn. For details, see Japanese Patent Application Publication No. 9028/1981, Patent Application Public Disclosure Nos. 13971/1979, 292895/1990, and 292894/1990, and Patent Application Publication Nos. 35711/1976 and 6701/1979. This treatment dictates the final properties of the copper foil and also serves to provide a barrier for the foil.

According to the invention, the shiny side of a copper foil is treated for Zn-Ni alloying or Zn-Co alloying, accompanied or not accompanied with the treatment of the roughened side.

The Zn-Ni alloying treatment is performed, preferably using a Zn-Ni electrolytic plating bath, to form a very thin Zn-Ni alloy layer comprising from 50 to 97 percent by weight of Zn and from 3 to 50 percent by weight of Ni at a deposition rate of from 100 to 500 $\mu g/dm^2$. If the Ni content is less than 3 percent by weight, desirably improved thermal oxidation resistance is not attained. Conversely if it exceeds 50 percent by weight, both solder wettability and thermal oxidation resistance are lowered. If the deposition quantity of the Zn-Ni alloy layer is less than 100 $\mu g/dm^2$, no improvement in thermal oxidation resistance result. If it is more than 500 $\mu g/dm^2$, diffusion of Zn, etc. will decrease the electrical conductivity. Deterioration of the solder wettability is also feared in a process step where no flux is employed. Another reason for which the deposition quantity is kept low is to maintain substantially a foil appearance and color inherent to copper.

The Zn-Co alloying treatment is also performed, preferably using a Zn-Co electrolytic plating bath, to form a very thin Zn-Co alloy layer comprising from 50 to 97 percent by weight of Zn and from 3 to 50 percent by weight of Co at a deposition quantity of from 100 to 500 $\mu g/dm^2$. If the Co content is less than 3 percent by weight, desirably improved thermal oxidation resistance is not be attained. Conversely if it exceeds 50 percent by weight, both solder wettability and thermal oxidation resistance are lowered. If the deposition quantity of the Zn-Co alloy layer is less than 100μg/dm$^2$, no improvement in thermal oxidation resistance result. If it is more than 500 μg/dm$^2$, diffusion of Zn, etc. will decrease the electrical conductivity. Deterioration of the solder wettability is also feared in a process step where no flux is employed. Another reason for which the deposition quantity is kept low is to maintain substantially a foil appearance and color inherent to copper.

Typical composition of the Zn-Ni or Zn-Co plating bath and conditions for plating are as follows:

| | |
|---|---|
| Zn | 5–50 g/l |
| Ni or Co | 5–50 g/l |
| pH | 2.5–4 |
| Temperature | 30–60° C. |
| Current density | 0.5–5 A/dm$^2$ |
| Plating time | 1–10 sec. |

After water rinsing, the Zn-Ni alloy layer or Zn-Co alloy layer is treated to form a Cr-base corrosion-preventive coating layer thereon. The term "Cr-base corrosion-preventive coating layer" as used herein means a corrosion-preventive coating layer based on chromium oxide formed (1) as a film of chromium oxide alone or (2) as a mixed film of chromium oxide and zinc and/or zinc oxide or (3) as a combination of the two films.

The film of chromium oxide alone may be formed by either immersion or electrolytic chromate treatment. Where atmospheric corrosion resistance is a requisite, electrolytic chromate treatment is preferred. The conditions for immersion or electrolytic chromate treatment, whichever is adopted, conform to those established in the art to which this invention pertains. By way of example, the conditions for immersion and electrolytic chromate treatments are as follows:

| (A) Immersion chroamte treatment | |
|---|---|
| K$_2$Cr$_2$O$_7$ | 0.5–1.5 g/l |
| pH | 1.4–2.4 |
| Temperature | 20–60° C. |
| Time | 3–10 sec. |
| (B) Electrolytic chromate treatment | |
| K$_2$Cr$_2$O$_7$ (Na$_2$Cr$_2$O$_7$ or CrO$_3$) | 2–10 g/l |
| NaOH or KOH | 10–50 g/l |
| pH | 7–13 |
| Bath temp. | 20–80° C. |
| Current density | 0.05–5 A/dm$^2$ |
| Time | 5–30 sec. |
| Anode | Pt—Ti sheet, stainless steel sheet, etc. |

The treatment for forming a mixed film of chromium oxide and zinc and/or zinc oxide is a treatment for coating a surface with a corrosion-preventive layer of a zinc-chromium-base mixture consisting of zinc and/or zinc oxide and chromium oxide by electroplating, using a plating bath which contains a zinc salt or zinc oxide and a chromic salt. It is commonly known as electrolytic zinc-chromate treatment. The plating bath is typically a mixed aqueous solution of at least one of dichromates, such as K$_2$Cr$_2$O$_7$ and Na$_2$Cr$_2$O$_7$, and CrO$_3$; at least one of water-soluble zinc salts, such as ZnO, ZnSO$_4$. 7H$_2$O; and an alkali hydroxide.Typical plating bath composition and electrolysis conditions are as follows:

| (C) Electrolytic zinc-chromium treatment | |
|---|---|
| K$_2$Cr$_2$O$_7$ (Na$_2$Cr$_2$O$_7$ or CrO$_3$) | 2–10 g/l |
| NaOH or KOH | 10–50 g/l |
| ZnSO$_4$.7H$_2$O | 0.05–10 g/l |
| pH | 7–13 |
| Bath temp. | 20–80° C. |
| Current density | 0.05–5 A/dm$^2$ |
| Time | 5–30 sec. |
| Anode | Pt—Ti sheet, stainless steel sheet, etc. |

The chromium oxide is required to form a deposit at the quantity of at least 15 μg/dm$^2$ as chromium, and the zinc at the quantity of at least 30 μg/dm$^2$. The thickness of the coating film may differ with the roughened side and the shiny side of the foil. Procedures for such treatment for corrosion prevention are described in printed publications, such as of Patent Application Publication Nos. 7077/1983, 33908/1986, and 14040/1987. The combination of the treatment for forming the film of chromium oxide alone and that for forming the film of a mixture consisting of chromium oxide and zinc/zinc oxide is also effective.

The copper foil thus treated, after water rinsing and drying, exhibits a high thermal oxidation resistance, undergoing no discoloration upon being subjected to high temperature conditions of 240° C. for 30 minutes or 270° C. for 10 minutes. Moreover, its other properties, including solder wettability and adhesion to resist, remain unaffected. In contrast to this, a conventionally zinc plated and chromate-treated copper foil is less resistant to thermal oxidation, e.g., remaining undiscolored for only about 30 minutes at 200° C.

Lastly, when necessary, principally to tighten the bond between the copper foil and the resin base, silane treatment is conducted whereby a silane coupling agent is applied to at least the roughened surface of the corrosion-preventive coating layer. The method of application may be by a spraying of a silane coupling agent solution, application by a coater, immersion, or curtain coating. For instance, Patent Application Publication No. 15654/1985 discloses that the bond between a copper foil and a resin base is increased by chromate-treating the roughened side of the copper foil and then treating the chromate-treated surface with a silane coupling agent. For the details refer to the particular publication.

When the necessity arises thereafter, the copper foil may be annealed for added ductility.

Examples and comparative examples are set forth for the purpose of illustration. It is to be noted that this invention is not limited by these examples.

EXAMPLE 1 AND COMPARATIVE EXAMPLE 1

A rolled copper foil was surface treated (on the shiny side) in a sequence of steps, i.e., (1) plating with a Zn-Ni alloy or Zn alone→water rinsing→(2) Cr immersion plating→water rinsing→drying. On the other hand, the roughened side after copper roughening was Cu-Ni treated and then Cr immersion plated. The conditions for (1) Zn-Ni alloy plating, (2) Cr immersion plating, and (3) Cu-Ni alloy plating were as follows:

| (1) Zn—Ni alloy (or Zn only) plating | |
| --- | --- |
| Zn | 20 g/l |
| Ni | 0 or 10 g/l |
| pH | 3 |
| Temperature | 40° C. |
| Current density | 2 A/dm$^2$ |
| Plating time | 1.5 sec. |
| (2) Cr immersion plating | |
| $K_2Cr_2O_7$ | 1 g/l |
| pH | 2.0 |
| Temperature | 40° C. |
| Time | 5 sec. |
| (3) Cu—Ni alloy plating | |
| Cu | 5–10 g/l |
| Ni | 10–20 g/l |
| pH | 1–4 |
| Temperature | 20–40° C. |
| Current density | 10–30 A/dm$^2$ |
| Plating time | 2–5 sec. |

The products (Nos. 1 and 2) thus obtained were tested for the quantity of surface deposit, baking, and solder wettability of the shiny side. For the surface analysis, the roughened side was masked by pressing with a base material, such as a proprietary product "FR-4", the foil was immersed in an acid to dissolve out Zn and Ni only from the shiny side, which were analyzed by atomic absorption spectroscopy. For the baking test, each piece of copper foil, 600 mm wide and 100 mm long, was charged into an oven at a predetermined temperature, taken out, and inspected to see if the shiny side had discolored criteria (○=not discolored; x= discolored). As for the solder wettability, a pressed base was dipped perpendicularly into a soldering tank using as the flux a product of San-ei Kagaku K. K. marked under the trade name "JS64". The wetting angle of the solder sucked up along the base surface was measured. The smaller the angle the better the solder wettability.

The test results were as follows:

| | | | Deposition quantity ($\mu g/dm^2$) | | | Baking test | | Solder wettability | |
| --- | --- | --- | --- | --- | --- | --- | --- | --- | --- |
| | Zn | Ni | | | | 240° C./ | 270° C./ | Wetting | Wettabi- |
| No. | (g/l) | (g/l) | Zn | Ni | Cr | 30 min | 10 min | angle | lity |
| 1 | 20 | 0 | 230 | — | 26 | x | x | 39.5 | 100% |
| 2 | 20 | 10 | 230 | 28 | 26 | ○ | ○ | 42.7 | 100% |

The test results made it certain that:

(1) Compared with the Zn-plated product, the Zn-Ni- plated product contained about 11% Ni in the coating film;

(2) With regard to the thermal oxidation resistance of the shiny side, the Zn-plated product discolored whereas the Zn-Ni-plated product showed very good oxidation resistance with no discoloration; and (3) As for the solder wettability, there was little difference and the 100% wettability in the both cases posed no problem.

EXAMPLE 2 AND COMPARATIVE EXAMPLE 2

A rolled copper foil was surface treated, on the shiny side, in a sequence of steps, i.e., plating with a Zn-Co alloy (or Zn alone)→water rinsing→Cr immersion plating→ water rinsing→drying. On the other hand, the roughened side was Cu-Ni treated and then Cr immersion plated. The conditions for Zn-Co alloy (or Zn) plating was as follows. The Cr immersion plating and the Cu-Ni alloy plating were conducted as in the example 1:

| Zn—Co alloy (or Zn only) plating | |
| --- | --- |
| Zn | 20 g/l |
| Co | 0 or 10 g/l |
| pH | 3 |
| Temperature | 40° C. |
| Current density | 2 A/dm$^2$ |
| Plating time | 1.5 sec. |

The products thus obtained were tested for the amount of surface deposit, baking, and solder wettability of the shiny ht side. The test results were as follows:

| | | | Deposition quantity ($\mu g/dm^2$) | | | Baking test | | Solder wettability | |
| --- | --- | --- | --- | --- | --- | --- | --- | --- | --- |
| | Zn | Co | | | | 240° C./ | 270° C./ | Wetting | Wettabi- |
| No. | (g/l) | (g/l) | Zn | Ni | Cr | 30 min | 10 min | angle | lity |
| 3 | 20 | 0 | 230 | — | 26 | x | x | 39.5 | 100% |
| 4 | 20 | 10 | 230 | 23 | 30 | ○ | ○ | 42.7 | 100% |

The test results made it certain that:

(1) Compared with the Zn-plated product, the Zn-Co-plated product contained about 9% Co in the coating film;

(2) With regard to the thermal oxidation resistance of the shiny side, the Zn-plated product discolored whereas the Zn-Co-plated product showed very good oxidation resistance with no discoloration; and (3) As for the solder wettability, there was little difference and the 100% wettability in the both cases posed no problem.

ADVANTAGES OF THE INVENTION

The product of the present invention is improved in thermal oxidation resistance over the conventional products that are combinedly zinc plated and chromate treated. It can meet the future requirements for the copper foil for printed circuits, since it prevents the discoloration of the shiny side due to the thermal hysteresis it will experience during the future fabrication of printed circuit boards, without adversely affecting the other properties of the copper foil, such as solder wettability and adhesion to resist.

What we claim is:

1. A process for the surface treatment of a copper foil printed circuits, said copper foil having a shiny side and a roughened side, comprising, on the shiny side of the foil, the steps of:
   (a) directly forming on the shiny side of the copper foil at a deposition quantity of from 100 to 500 µg/dm² either
      (i) a Zn-Ni alloy layer consisting of from 50 to 97 percent by weight of Zn and from 3 to 50 percent by weight of Ni or
      (ii) a Zn-Co alloy layer consisting of from 50 to 97 percent by weight of Zn and from 3 to 50 percent by weight of Co; and
   (b) then forming a Cr-base corrosion preventative coating layer on said Zn-Ni or Zn-Co alloy layer,
whereby said shiny side acquires a thermal oxidation resistance of 240° C. for 30 minutes or 270 ° C. for 10 minutes.

2. The process of claim 1 in which the roughened side of the copper foil is treated to form thereon a layer of a single metal or art alloy of two or more metals selected from the group consisting of Cu, Ni, Fe, Co, and Zn.

3. The process of claim 2 in which the Cr-base corrosion-preventive coating layer is formed of a chromium oxide film by immersion chromate or electrolytic chromate treatment.

4. The process of claim 2 in which the Cr-base corrosion-preventive coating layer is formed of a mixed film of chromium oxide and zinc and/or zinc oxide by electrolytic zinc-chromium treatment.

5. The process of claim 2 in which the Cr-base corrosion-preventive coating layer is formed by forming a chromium oxide film by immersion chromate or electrolytic chromate treatment followed by forming a mixed film of chromium oxide and zinc and/or zinc oxide by electrolytic zinc-chromium treatment.

6. The process of claim 1 in which the Cr-base corrosion-preventive coating layer is formed of a chromium oxide film by immersion chromate or electrolytic chromate treatment.

7. The process of claim 1 in which the Cr-base corrosion-preventive coating layer is formed of a mixed film of chromium oxide and zinc and/or zinc oxide by electrolytic zinc-chromium treatment.

8. The process of claim 1 in which the Cr-base corrosion-preventive coating layer is formed by forming a chromium oxide film by immersion chromate or electrolytic chromate treatment followed by forming a mixed film of chromium oxide and zinc and/or zinc oxide by electrolytic zinc-chromium treatment.

9. A process for the surface treatment of a copper foil for printed circuits, said copper foil having a shiny side and a roughened side, comprising, on the shiny side, the steps of:
   (A) on the foil shiny side:
      (a) directly forming on the shiny side of the copper foil at a deposition quantity of from 100 to 500 µg/dm² either
         (i) a Zn-Ni alloy layer consisting of from 50 to 97 percent by weight of Zn and from 3 to 50 percent by weight of Ni or
         (ii) a Zn-Co alloy layer consisting of from 50 to 97 percent by weight of Zn and from 3 to 50 percent by weight of Co; and
      (b) then forming a Cr-base corrosion preventative coating layer on said Zn-Ni or Zn-Co alloy layer; and
   (B) on the foil roughened side:
      (a) treating the roughened side of the copper foil to form a layer of a single metal or an alloy of two or more metals selected from the group consisting of Cu, Ni, Fe, Co, and Zn, and
      (b) then forming a Cr base corrosion preventative coating layer on the single metal or alloy layer,
whereby said shiny side acquires a thermal oxidation resistance of 240° C. for 30 minutes or 270 ° C. for 10 minutes.

* * * * *